United States Patent [19]

Boudreau et al.

[11] Patent Number: 4,621,877
[45] Date of Patent: Nov. 11, 1986

[54] SECURING CABINET WALLS

[75] Inventors: Ronald B. Boudreau, Westford, Mass.; Charles F. Termini, Hampton Beach, N.H.

[73] Assignee: Digital Equipment Corporation, Maynard, Mass.

[21] Appl. No.: 636,862

[22] Filed: Aug. 1, 1984

[51] Int. Cl.⁴ ............................................. A47B 45/00
[52] U.S. Cl. ................................ 312/257 R; 312/140; 312/263
[58] Field of Search ............... 312/296, 140, 257 R, 312/257 SR, 263, 257 SM; 403/392, 397

[56]  References Cited
U.S. PATENT DOCUMENTS

| 3,926,492 | 12/1975 | Gutner | 312/348 |
| 4,322,572 | 3/1982 | Snyder | 312/257 R |
| 4,395,080 | 7/1983 | Winn et al. | 312/257 R |

Primary Examiner—Francis K. Zugel
Assistant Examiner—Joseph Falk
Attorney, Agent, or Firm—William E. Cleaver

[57] ABSTRACT

The present arrangement enables first and second section, or first second and third sections, of a housing device to be secured together without the necessity of a plurality of screws, or winged nuts, or clamps, or the like. In a preferred embodiment two side walls are formed with grooved edges. Each of the groove edges has its outer wall placed in abutment with a different associated resilient gasket and between the resilient gaskets there is located an extension member of a third wall. The grooved edges have an inverted U-shaped compression strip forced thereinto and the compression strip in turn forces the outer walls of the grooved edges toward the resilient gaskets which in turn are squeezed against the extension member thereby locking the three walls together rapidly. The removal of the compression strip enables the side walls to be free and hence separatable to enable the user to work on items inside of the housing.

4 Claims, 4 Drawing Figures

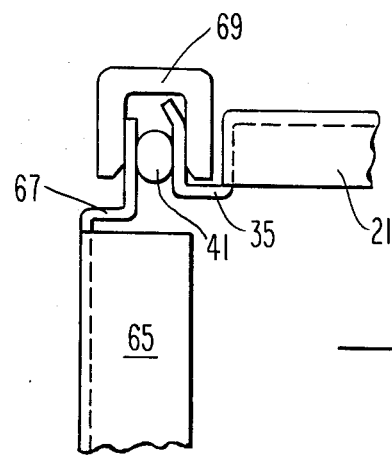
_Fig. 2_
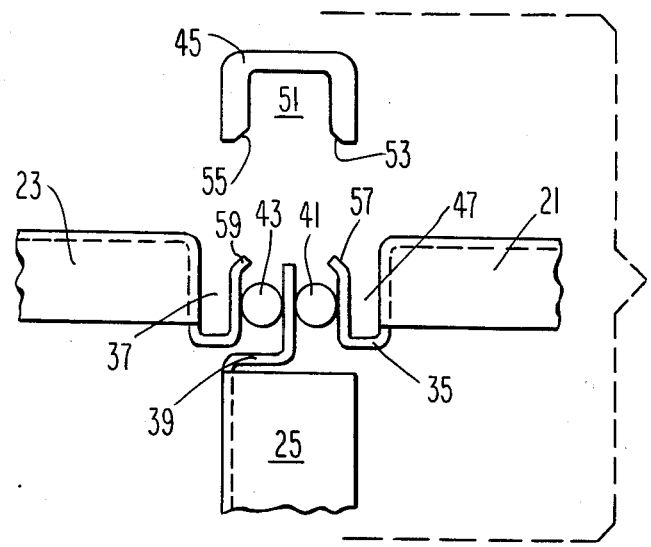
_Fig. 3_
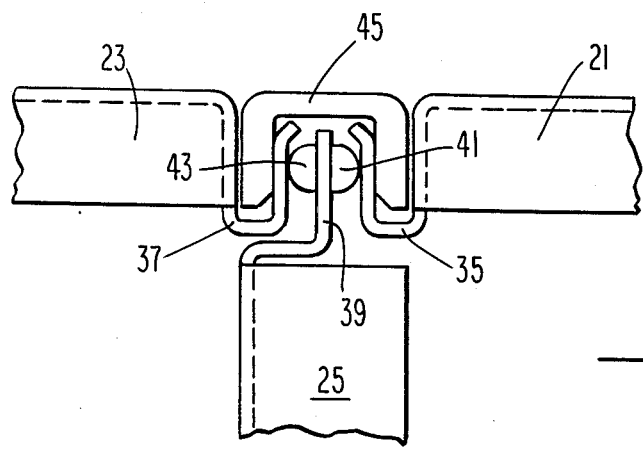
_Fig. 4_

SECURING CABINET WALLS

BACKGROUND

It has become common practice in the devices which house electronic circuits to provide a means for enabling a service person, or an engineer, to remove a panel, or wall, of the housing in order to service, or repair, the electronic circuitry. Heretofore, such arrangements have employed a plurality of screws, a plurality of winged nuts on screws, a plurality of latches on the removable walls to be turned, or fitted, into receiving receptacles on the stationary part of the housing, a plurality of hinges, and the like. All of the foregoing arrangements suffer by having the locking devices such as the screws, wing nuts, etc., get lost, or wear, and give rise to a poor fit. In addition, all of the foregoing arrangements require the user to spend a significant amount of time undoing the housing walls in order to be able to repair the circuitry or in replacing the housing walls once the repair job has been completed.

In as much as the electronic equipment is the source of electro-magnetic interference (EMI) signals and/or radio frequency interference (RFI) signals it is important that the walls maintain a good fit in order to provide a shield for equipment outside of the housing against such signal noise. The present arrangement enables the user to readily "get at" the electronic gear for repair purposes, or whatever, without having to undo a plurality of screws, a plurality of latches, and the like and the present arrangement also provides a good fit and a basis for continuing good shielding.

SUMMARY

The securing arrangement taught and claimed herein includes having, along the edge of removable walls U-shaped, or groove-shaped, metallic strips. A stationary wall to which a removable wall is to be secured is equipped with an extension member. If a single removable wall is to be secured to a stationary wall, then the U-shaped metallic strip, or matching means, on the removable wall is placed in close proximity to the extension member and in between there is located a resilient (and compressible) gasket. A U-shaped compression strip, employed in an inverted U-position, is fitted over the outside of the extension member and into the groove of the metallic strip on the removable wall. The compression strip forces the U-shaped metallic strip towards the extension member, thereby squeezing the resilient member. The resilient member, of course, provides a force in the two directions i.e. against the extension member, and against the U-shaped metallic strip, thus locking the assembly by the force of friction. Accordingly, the removable wall is secured to the stationary wall. In another mode two removable walls can be locked to a stationary wall. In the last mentioned arrangement, the metallic strips of the removable walls are located on opposite sides of the extension member. In addition there is a resilient gasket between each of the metallic strips and each side of the extension strip. The assembly is squeezed together by inserting the compression strip into the grooves of each of the U-shaped metallic strips of the removable walls. Accordingly, the two removable walls are locked together and are locked to the stationary wall. In addition, the compression strip is, or can be, screwed into the stationary wall, or to some other portion of the stationary housing, with a single screw if the user so desires.

The objects and features of the present invention will be better understood in view of the following description taken in conjunction with the drawings wherein:

FIG. 2 shows the present device as arranged to lock a single removable wall to a stationary wall;

FIG. 3 shows the present arrangement with two removable walls about to be secured to a stationary wall; and FIG. 4 shows the insertion of the compression strip to secure the arrangement shown in FIG. 3.

Figure 1:
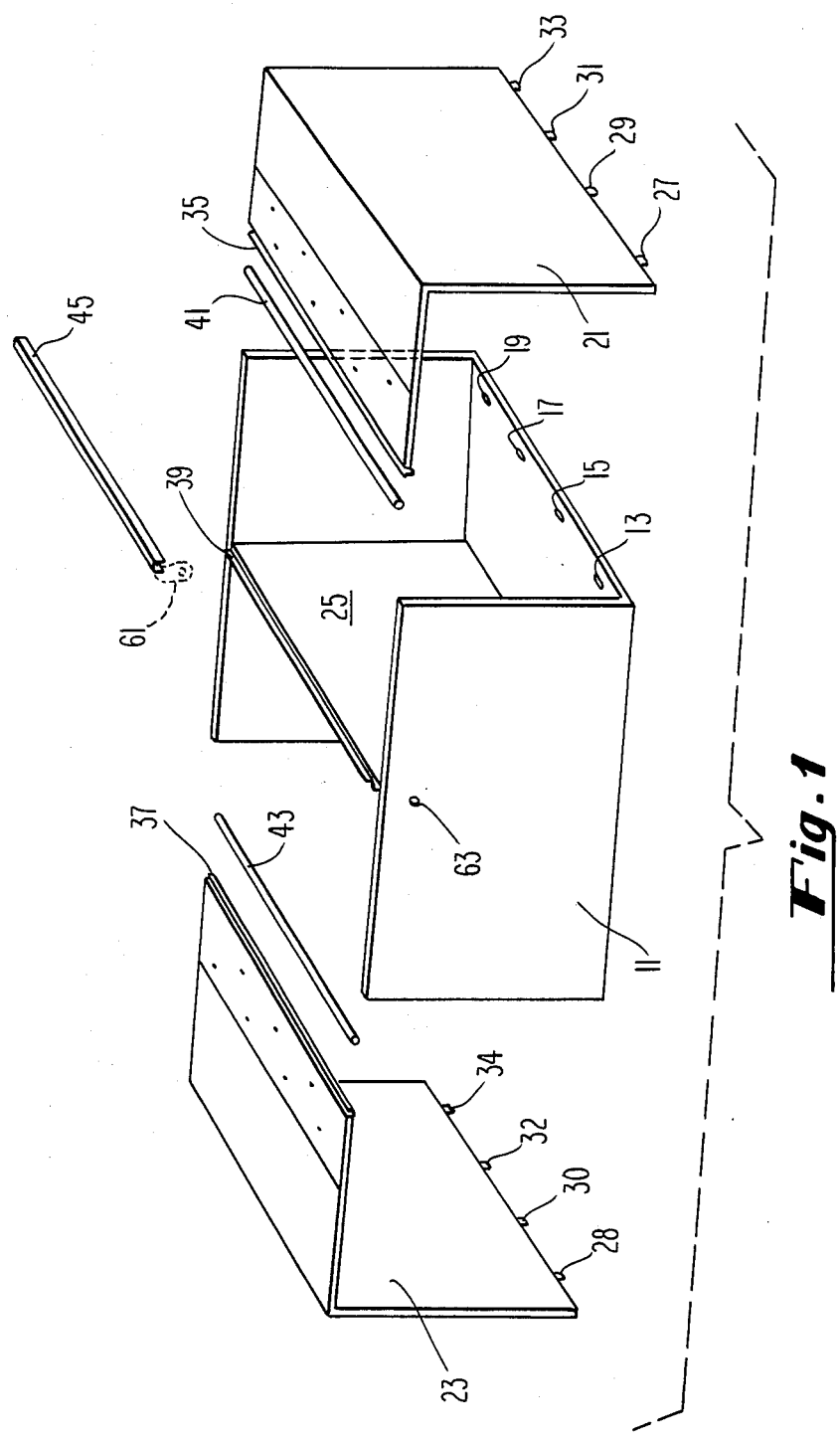
FIG. 1 shows an exploded view of the housing device and the elements of the present securing arrangement.

Consider FIG. 1. In FIG. 1 there is shown an exploded view of a housing or cabinet in which electronic gear is housed for the purpose of operating as a computer or a radar set or a television set or any number of other forms of electronic gear. The electronic circuitry is not shown in FIG. 1 because it is not related to the invention. In FIG. 1 the stationary portion of the housing is depicted as identifying numeral 11. As can be seen in the right hand portion of the base there are located four holes 13, 15, 17 and 19. It should be understood that similar holes are located on the left hand portion of the base although those holes cannot be seen in FIG. 1. As also can be gleaned from FIG. 1 there are two removable walls 21 and 23. While in the present description the invention is described in connection with two removable walls, or one removable wall, it should be understood that the present arrangement could be used with a plurality of walls provided that the compression strip is located to force the locking walls together and the resilient members provide the opposite force to create or activate the friction forces.

When the assembly shown in FIG. 1 is to be locked together so that the electronic circuitry within the cabinet, or housing, 11 is to be covered from the outside world and shielded so as to prevent the radio frequency interference and the electro-magnetic interference from disturbing other devices, the removable walls 21 and 23 will be moved toward the center stationary wall 25. On each of the removable walls there are located tabs 27 through 34. The tabs 27, 29, 31, 33 are inserted into the holes 13, 15, 17, and 19, while the tabs 28, 30, 32, and 34 are inserted into the holes in the left hand portion of the base. As can be seen in FIG. 1 on the removable wall 21 there is located a U-shaped metallic strip 35, while on the removable wall 23 there is located a U-shaped metallic strip 37. The U-shaped metallic strips 35 and 37 are matching means to be matched with the extension strip 39 to be described hereinafter. At the end of the stationary wall 25 there is an extension member or extension strip 39. In order to effect the securing assembly, the U-shaped metallic strip 35 is located in close proximity to the extension 39 on the right hand side, while the U-shaped metallic strip 37 is located in close proximity to the extension 39 on the left hand side. In between the U-shaped metallic strip 35 and the extension strip 39 there is located a resilient gasket 41. In a preferred embodiment, the resilient gasket 41 is made of rubber but other forms of compressible resilient material could be used. In like fashion, between the U-shaped metallic strip 37 and the extension member 39 there is located a resilient gasket 43.

The arrangement of the U-shaped metallic strips and the extension 39, as well as the resilient members can be better seen in FIGS. 3 and 4. In FIG. 3 the assembly is shown prior to the insertion of the compression strip 45. As can be seen in FIG. 3, the removable wall 21 with its U-shaped metallic strip 35 is located in close proximity to the extension member 39 of the stationary wall 25. In like manner as can be seen in FIG. 3 the removable wall 23 with its U-shaped metallic strip 37 is located in close proximity to the extension member 39 but on the opposite side from the removable wall 21. As can be seen in FIG. 3 the resilient gaskets 41 and 43 are still in their fully rounded position. In other words, they have not been squeezed together, or forced towards one another as will happen when the compression strip 45 is inserted into the grooves 47 and 49 respectively of the U-shaped metallic strips 35 and 37. As can be seen in FIG. 3 the compression strip 45 which is used in an inverted U-mode has an inner groove 51 which is not as wide as the distance between the grooves 47 and 49 prior to the insertion of the compression member 45. In other words, when the compression member 45 is inserted into the grooves 47 and 45 it will force the U-shaped metal strips 35 and 37 toward one another thus squeezing the resilient members 41 and 43. It will be noted that the inside corners of the compression strip 45 are beveled at positions 53 and 55 to permit the easy movement downward against the beveled ends 57 and 59 during the insertion process.

If we examine FIG. 4 we find that the compression strip 45 has been inserted and hence the U-shaped metal strips 35 and 37 have been moved closer together, that is closer towards one another, thereby compressing the resilient members 41 and 43. The resilient members 41 and 43 exert force in the opposite direction and hence all of the surfaces are in tight frictional abutment thereby locking the removable walls 21 and 23 to the stationary wall 25. As mentioned above in the summary, if the user so desires the compression strip 45 can be screwed into the stationary portion of the housing by a single screw. This feature is shown in FIG. 1 by the tab 61 shown in phanthom. Tab 61 has a screw hole therein along which matches screw hole 63 shown in the stationary portion of the housing 11.

It should be understood that, although the gaskets 41 and 43 are shown in FIG. 1 as being separated in the explosion view, in a preferred embodiment the gaskets are clipped to, or cemented to, the inside walls of the metallic strips 35 and 37 so that they are automatically put in place when the removable walls 21 and 23 are positioned for a "lock-up". It should also be understood that although it is not part of the present invention, the side edges of the removable walls would have gaskets thereon to insure the sealing effect.

The present invention shown in the mode of locking a single removable wall into a fixed wall is depicted in FIG. 2. In FIG. 2 there is shown the removable wall 21 along with its U-shaped metallic strip 35 and its resilient gasket 41. The removable wall 21 in the mode shown in FIG. 2 is being secured to a stationary wall 65 which has an extension member 67. The compression strip 69 used in the configuration of FIG. 2 is not as wide as the compression strip 45 previously discussed because the compression strip 69 only has to force the U-shaped metallic strip 35 against the extension member 67 and compress one resilient gasket 41. All of the features previously described are present in the arrangement shown in FIG. 2 and no further explanation thereof is deemed necessary.

The compression strips 45 and 69 in the preferred embodiment are fabricated from steel. Further in the preferred embodiment the gaskets 41 and 43 are secured to the U-shaped metallic strips by plastic clips although other forms of clip on means, or rubberized cement and the like, could be used. The U-shaped metallic strips 35 and 37 as well the extension members 39 and 67 in a preferred embodiment are fabricated from steel although other forms of suitable materials could be used. As can be gleaned from FIG. 1 the U-shaped metallic strips are riveted to the top of the removable wall but other forms of securing the U-shaped metallic strips could be employed. In one embodiment the U-shaped metallic strips are formed integral with the removable wall. The present securing arrangement enables the service person, or the engineer, or who ever has the need to get into the cabinet, or housing 11, to simply remove the compression strip thereby freeing up the removable walls. Thus, those walls can be separated from the stationary portion of the housing thereby enabling the repairman, or engineer, or whomever, to readily get at the electronic circuitry which is located in the housing. At the same time by employing the present arrangement the electronic circuitry is shielded so as not to disturb the outside world and the re-assembly is relatively simple. In other words, in order to re-assemble the removable walls, the removable walls are just pushed toward the center fixed wall and are squeezed together by the re-insertion of the compression strip 45 or 69.

We claim:

1. A securing arrangement for securing a horizontally oriented wall of a cabinet with a vertically oriented wall of a cabinet and for alternatively enabling said horizontally oriented wall to be readily separated from said vertically oriented wall and wherein said horizontally oriented wall and said vertically oriented wall each have at least one horizontally oriented edge, comprising in combination: extensions means secured to and disposed to lie along said horizontally oriented edge of said vertically oriented wall, said extension means formed to extend vertically from said last mentioned horizontally oriented edge; groove member means secured to, and disposed to lie along, said horizontally oriented edge of said horizontally oriented wall, said groove member means having a groove therein; said extension means and said groove member means each having a facing surface disposed in close proximity to one another and each having an outside surface lying away from its respective said facing surface; resilient means, having a compressed state and an uncompressed state, disposed to fit between said facing surfaces of said extension means and said grove member means whereby in it uncompressed state it separates said outside surfaces respectively of said extension means and said groove member means from one antoher by a first distance and whereby in its compressed state it provides an outward force; compression strip means formed to have a channel therein which is substantially U shaped and wherein the distance across said channel is smaller than said first distance, said compression means disposed vertically over said extension means and said groove member means to force said extension means and said groove member means against said resilient means to squeeze said resilient means into its compressed state whereby the outward force of said resilient means causes said compression strip means as well as said extension means and said groove member means to be secured together and whereby said compression strip means is readily removable vertically in response to compressing said resilient means thereby enabling said extension means and said groove member means to be readily separated.

2. A securing arrangement according to claim 1 wherein said resilient means is a compressible resilient gasket.

3. A securing arrangement for securing first and second horizontally oriented walls of a cabinet with a vertically oriented wall of a cabinet and for alternatively enabling said first and second horizontally oriented walls to be readily separated from said vertically oriented wall and wherein said first and second horizontally oriented walls and said vertically oriented wall each have at least one horizontally oriented edge, comprising in combination: extension means secured to, and disposed to lie along, said horizontally oriented edge of said vertically oriented wall, said extension means formed to extend vertically from said last mentioned horizontally oriented edge; first and second groove member means respectively secured to, and respectively disposed to lie along, said horizontally oriented edge of said first horizontally oriented wall and said horizontally oriented edge of said second horizontally oriented wall, each of said first and second groove member means having a groove therein; said extension means and said first groove member means each respectively having facing surfaces disposed in close proximity to one another, said extension means and said second groove member means each respectively having facing surfaces disposed in close proximity to one another, said first and second groove member means respectively having outside surfaces which respectively lie away from said facing surfaces; first and second resilient means, each having a compressed state and an uncompressed state, said first resilient means disposed to fit between said facing surface of said extension means and said first groove member means and said second resilient means disposed to fit between said facing surfaces of said extension means and said second groove member means whereby when said first and second resilient means are in their uncompressed state the outside surfaces of said first and second groove member means are separated from each other by a first distance and whereby when said first and second resilient means are in their compressed state they respectively provide an outward force; compression strip means formed to have a channel therein which is substantially U shaped and wherein the distance across said channel is smaller than said first distance, said compression means disposed vertically over said outside surfaces of said first and second groove member means to force said first and second groove members to squeeze said first and second resilient means into their respective compressed states against said extension means whereby the outward forces of said first and second resilient means causes said compression strip means as well as said extension means and said first and second groove member means to be secured together and whereby said compression strip means is readily removable vertically in response to compressing said first and second resilient means thereby enabling said first and second horizontally oriented walls and said vertically oriented to be readily separated.

4. A securing arrangement according to claim 3 wherein said first and second resilient members is each a compressible resilient gasket.

* * * * *